United States Patent [19]

Schülke

[11] 4,367,768

[45] Jan. 11, 1983

[54] REFRACTORY PROTECTIVE TUBE FOR THE HEAT TREATMENT OF SEMICONDUCTOR COMPONENTS

[75] Inventor: Karl A. Schülke, Neuberg, Fed. Rep. of Germany

[73] Assignee: Heraeus Quarzschmelze GmbH, Hanau, Fed. Rep. of Germany

[21] Appl. No.: 122,089

[22] Filed: Feb. 19, 1980

[30] Foreign Application Priority Data

Feb. 24, 1979 [DE] Fed. Rep. of Germany ....... 2907371

[51] Int. Cl.³ .............................................. C23C 13/08
[52] U.S. Cl. .................................. 137/527.6; 118/715; 137/535
[58] Field of Search ............ 137/587, 589, 535, 527.6; 118/715, 724, 733, 50.1, 719; 215/260, 307, 309, 311, 315; 220/314

[56] References Cited

U.S. PATENT DOCUMENTS

| | | | |
|---|---|---|---|
| 418,867 | 1/1890 | Dundon | 220/314 |
| 554,344 | 2/1896 | McCormick | 220/314 |
| 1,246,892 | 11/1917 | Donnelly | 137/535 |
| 2,612,406 | 9/1952 | Kurata | 137/535 X |
| 3,274,917 | 9/1966 | Tolbert, Sr. | 137/527.6 X |
| 3,823,685 | 7/1974 | Koepp et al. | 118/715 |
| 3,900,597 | 8/1975 | Chroma et al. | 118/724 X |
| 4,173,944 | 11/1979 | Koppl et al. | 427/86 X |

*Primary Examiner*—Robert G. Nilson
*Attorney, Agent, or Firm*—Sprung, Horn, Kramer & Woods

[57] ABSTRACT

In a refractory protective tube for the heat treatment of semiconductor components which is constricted at one end and at such constricted end is provided with a treating or working gas inlet, said tube having opposite to said gas inlet a closed end provided with a gas outlet, the improvement for the prevention of back diffusion of ambient air wherein said closed end is closed by a cover which is fastened to a holding bracket which is movably suspended from the tube.

9 Claims, 1 Drawing Figure

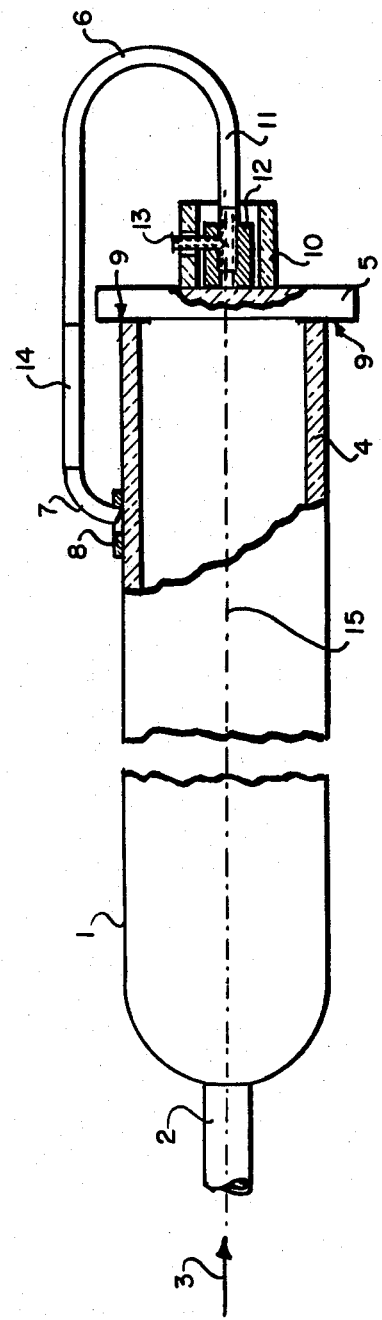

REFRACTORY PROTECTIVE TUBE FOR THE HEAT TREATMENT OF SEMICONDUCTOR COMPONENTS

BACKGROUND OF THE INVENTION

1. Field of the Invention

The invention relates to a refractory protective tube, and in particular a vitreous-silica tube, for the heat treatment of simiconductor components, wherein at one end of which, during the heat treatment, a treating or working gas is introduced. This end is constricted and is disposed opposite a closed end, closed except for a gas outlet.

2. Discussion of the Prior Art

Protective tubes of this type are on the market in the form of vitreous-silica tubes. (See pages 8 to 9 of Applicant's pamphlet Q-B 3/112, "Quarzglas für die Halbleiter-Technik" [Vitreous silica for use in semiconductor engineering], issued in November, 1974.)

The unconstricted end of the vitreous-silica tube is constructed, in particular, as a conical ground joint which is closed by means of a mating ground cap provided with a relatively small vent hole through which there is but little back diffusion of ambient air because of the locally increased gas velocity during the heat treatment of semiconductor components. The action of the vent hole depends, of course, on the flow rate of the treating or working gas and is exerted only when a predetermined gas flow rate is reached or exceeded.

It is the object of the invention to provide a refractory protective tube, and in particular a vitreous-silica tube, for the heat treatment of semiconductor components which is adapted to be used with an internal pressure higher than the ambient atmospheric pressure on the tube and wherein the risk of back diffusion of ambient air into the protective tube is positively eliminated regardless of the flow rate of the treating or working gas.

SUMMARY OF THE INVENTION

In accordance with the invention, this object is accomplished, in a refractory protective tube of the type outlined above, in that for the prevention of back diffusion of ambient air the end of the tube opposite the constricted end is closed by means of a cover which is fastened to a holding bracket that is movably suspended from the tube. Said cover is preferably made of the same material as the protective tube.

It has been found advisable that the cover be ground at least in the area of the contact surface. The holding bracket is made of a refractory and corrosion-resistant metal, high-grade steel having proved particularly well suited for the purpose. The free end of the holding bracket is advantageously hooked into a holding ring which is attached to the tube in the vicinity of the tube end to be closed by the cover. The cover and the forward end of the holding bracket are advantageously joined to each other so as to be detachable.

To permit precise positioning of the cover over the end of the tube which is to be closed, the holding bracket is made adjustable in the area of the cover.

THe protective tube constructed in accordance with the invention offers the advantage that the cover will close the end of the tube with a defined contact pressure. However, the cover will yield to effluent treating or working gas so that with any gas flow rate only the smallest required vent opening is provided and back diffusion of ambient air is prevented regardless of the gas flow rate.

By means of protective-tube closure in accordance with the invention, the flow rate of the treating or working gas can be maintained at a level lower than that of prior art protective tubes. This amounts to a cost saving since the treating or working gas is a gas of the highest purity.

BRIEF DESCRIPTION OF DRAWING

An embodiment of the protective tube in accordance with the invention is shown diagrammatically in the accompanying drawing.

DESCRIPTION OF SPECIFIC EMBODIMENT

The protective tube, which in this embodiment is made of vitreous silica, is designated 1. Said tube is constricted at one of its ends, 2. During the heat treatment, a treating or working gas is introduced through that end 2, as indicated by the arrow 3. The tube end 4 opposite the constricted end is closed by means of the cover 5, which is fastened to a holding bracket 6. The free end 7 of the holding bracket 6 is movably suspended from the tube 1 and projects into a vitreous-silica ring 8 which is welded to the tube. The holding bracket 6 is made of a refractory and corrosion-resistant metal such as high-grade steel.

The contact surface 9 of the cover 5 which abuts against the tube end 4 is ground. The cover 5 is welded to a vitreous-silica socket 10. The end 11 of the holding bracket 6 projects into a threaded bushing 12 set into said socket and is maintained therein by means of a setscrew 13. In the embodiment illustrated, the threaded bushing 12 is also made of high-grade steel. It is set into the socket 10 with some play. When the setscrew 13 is loosened, the cover 5 can be turned and thus adjusted for precise seating on the tube end 4. This has been accomplished when the holding bracket portion 14 between the holding ring and the tube end 4 extends parallel to the axis 15 of the tube 1.

What is claimed is:

1. In a refractory protective tube for the heat treatment of semi-conductor components which is constricted at one end and at such constricted end is provided with a treating or working gas inlet, said tube having opposite to said gas inlet a gas outlet to be closed, the improvement for the prevention of back diffusion of ambient air wherein said gas outlet is normally closed by a cover, which cover is fastened to a holding bracket which is pivotally movably suspended from the tube, said holding bracket yieldably biasing said cover toward said closed position and allowing movement of said cover away from said gas outlet in response to a predetermined pressure being attained within the tube.

2. A tube according to claim 1 which is made of vitreous silica.

3. A tube according to claim 2 wherein the cover is made of the same material as the protective tube.

4. A tube according to claim 2 wherein the cover is ground at least in the area of the contact surface with the tube.

5. A tube according to claim 2 wherein the holding bracket is made of a refractory and corrosion-resistant material.

6. A tube according to claim 5 wherein the holding bracket is made of high-grade steel.

7. A tube according to claim 1 wherein there is provided, in the vicinity of the tube end to be closed with the cover, a holding ring into which the free end of the holding bracket is hooked.

8. A tube according to claim 1 wherein the cover and the forward end of the holding bracket are detachably joined to each other.

9. A tube according to claim 1 wherein the holding bracket is adjustable in proximity to the cover.

* * * * *